US012660396B2

(12) United States Patent
Liu et al.

(10) Patent No.: US 12,660,396 B2
(45) Date of Patent: Jun. 16, 2026

(54) LIGHT-EMITTING DIODE PACKAGE STRUCTURE AND MANUFACTURING METHOD THEREOF

(71) Applicant: INGENTEC CORPORATION, Miaoli County (TW)

(72) Inventors: Ai-Sen Liu, Miaoli County (TW); Hsiao-Lu Chen, Miaoli County (TW); Yi-Chuan Huang, Miaoli County (TW); Hsiang-An Feng, Miaoli County (TW)

(73) Assignee: INGENTEC CORPORATION, Miaoli County (TW)

( * ) Notice: Subject to any disclaimer, the term of this patent is extended or adjusted under 35 U.S.C. 154(b) by 360 days.

(21) Appl. No.: 18/472,234

(22) Filed: Sep. 22, 2023

(65) Prior Publication Data

US 2024/0339579 A1 Oct. 10, 2024

(30) Foreign Application Priority Data

Apr. 7, 2023 (TW) ................................. 112113070

(51) Int. Cl.
*H10H 20/857* (2025.01)
*H10H 20/853* (2025.01)
*H10W 90/00* (2026.01)
*H10H 20/01* (2025.01)

(52) U.S. Cl.
CPC ........ *H10H 20/857* (2025.01); *H10H 20/853* (2025.01); *H10W 90/00* (2026.01); *H10H 20/0362* (2025.01); *H10H 20/0364* (2025.01)

(58) Field of Classification Search
None
See application file for complete search history.

(56) References Cited

U.S. PATENT DOCUMENTS

| | | | |
|---|---|---|---|
| 10,026,757 B1 * | 7/2018 | Chang | H10D 86/60 |
| 2011/0242797 A1 * | 10/2011 | Park | H05K 1/021 |
| | | | 362/97.3 |
| 2015/0129906 A1 | 5/2015 | Weigert | |

FOREIGN PATENT DOCUMENTS

| | | |
|---|---|---|
| KR | 10-2010-0134561 A | 12/2010 |
| KR | 10-2012-0119479 A | 10/2012 |
| WO | 2022/241713 A1 | 11/2022 |

* cited by examiner

*Primary Examiner* — Nicholas J Tobergte
(74) *Attorney, Agent, or Firm* — CKC & Partners Co., LLC

(57) ABSTRACT

A manufacturing method of a light-emitting diode package structure includes the steps as follows. A substrate is provided. At least one light-emitting diode and at least one dummy plug are arranged on the substrate in an arranging step. The light-emitting diode and the dummy plug are covered by the patternable material in a coating step. A portion of the light-emitting diode and a portion of the dummy plug are exposed in a patterning step. A conductive layer is in contact with and electrically connected to the light-emitting diode and the dummy plug in a deposition step. A protective layer is formed on the conductive layer in a protective layer forming step. The substrate is separated and a light-emitting diode package structure is formed in a releasing step. A material of the conductive layer includes an indium tin oxide material or a transparent conductive material.

9 Claims, 9 Drawing Sheets

100 a substrate is provided — 110 an arranging step is performed — 120 a coating step is performed — 130 a patterning step is performed — 140 a deposition step is performed — 150 a protective layer forming step is performed — 160 a releasing step is performed — 170

LIGHT-EMITTING DIODE PACKAGE STRUCTURE AND MANUFACTURING METHOD THEREOF

RELATED APPLICATIONS

This application claims priority to Taiwan Application Serial Number 112113070, filed Apr. 7, 2023, which is herein incorporated by reference.

BACKGROUND

Technical Field

The present disclosure relates to a light-emitting diode package structure. More particularly, the present disclosure relates to a light-emitting diode package structure and a manufacturing method thereof in which the efficiency and yield of the manufacturing process can be improved and the cost can be reduced.

Description of Related Art

A conventional manufacturing method of the light-emitting diode package structure is performed as follows. The light-emitting diode and the dummy plug are fixed on a substrate. Then, the light-emitting diode and the dummy plug are electrically connected by wire bonding, followed by being packaged with gel. However, the aforementioned manufacturing method includes relatively complicated steps, which affects the efficiency and yield of the manufacturing process. Also, the aforementioned substrate cannot be reused, which make the manufacturing cost increase significantly.

In this regard, it is a target which the industry is still working on to improve the efficiency and yield of packaging the light-emitting diode and reduce the cost thereof.

SUMMARY

According to one aspect of the present disclosure, a manufacturing method of a light-emitting diode package structure includes the steps as follows. A substrate is provided, an arranging step is performed, a coating step is performed, a patterning step is performed, a deposition step is performed, a protective layer forming step is performed, and a releasing step is performed. In the arranging step, at least one light-emitting diode and at least one dummy plug are arranged on a surface of the substrate. In the coating step, a patternable material is coated on the surface of the substrate, and the at least one light-emitting diode and the at least one dummy plug are covered by the patternable material. In the patterning step, the patternable material is patterned, and a portion of the at least one light-emitting diode and a portion of the at least one dummy plug are exposed from the patternable material. In the deposition step, a conductive layer is formed on a side of the patternable material away from the substrate, and the conductive layer is in contact with and electrically connected to the portion of the at least one light-emitting diode and the portion of the at least one dummy plug which are exposed. In the protective layer forming step, a protective layer is formed on a side of the conductive layer away from the substrate. In the releasing step, the substrate is separated from the patternable material, the at least one light-emitting diode and the at least one dummy plug, and a light-emitting diode package structure is formed. A material of the conductive layer includes an indium tin oxide material or a transparent conductive material.

According to another aspect of the present disclosure, a light-emitting diode package structure is made by the manufacturing method of the light-emitting diode package structure of the aforementioned aspect.

According to one another aspect of the present disclosure, a light-emitting diode package structure includes a patternable material layer, at least one light-emitting diode, at least one dummy plug, a conductive layer and a protective layer. The patternable material layer includes an upper surface and a bottom surface. The at least one light-emitting diode is buried in the patternable material layer, and a first surface of the at least one light-emitting diode is exposed from the bottom surface of the patternable material layer. The at least one dummy plug is buried in the patternable material layer, and a third surface of the at least one dummy plug is exposed from the bottom surface of the patternable material layer. The upper surface of the patternable material layer is covered by the conductive layer, and the conductive layer is in contact with and electrically connected to the at least one light-emitting diode and the at least one dummy plug. The protective layer covers the conductive layer. The patternable material layer includes at least two through holes, the at least one light-emitting diode includes a second surface opposite to the first surface, the at least one dummy plug includes a fourth surface opposite to the third surface, the at least two through holes extend from the upper surface of the patternable material layer to the second surface of the at least one light-emitting diode and the fourth surface of the at least one dummy plug, and the conductive layer is in contact with the second surface of the at least one light-emitting diode and the fourth surface of the at least one dummy plug through the at least two through holes. A material of the conductive layer includes an indium tin oxide material or a transparent conductive material.

BRIEF DESCRIPTION OF THE DRAWINGS

The present disclosure can be more fully understood by reading the following detailed description of the embodiment, with reference made to the accompanying drawings as follows.

DETAILED DESCRIPTION

The present disclosure will be further exemplified by the following specific embodiments. However, the embodiments can be applied to various inventive concepts and can be embodied in various specific ranges. The specific embodiments are only for the purposes of description, and are not limited to these practical details thereof.

Figure 1:
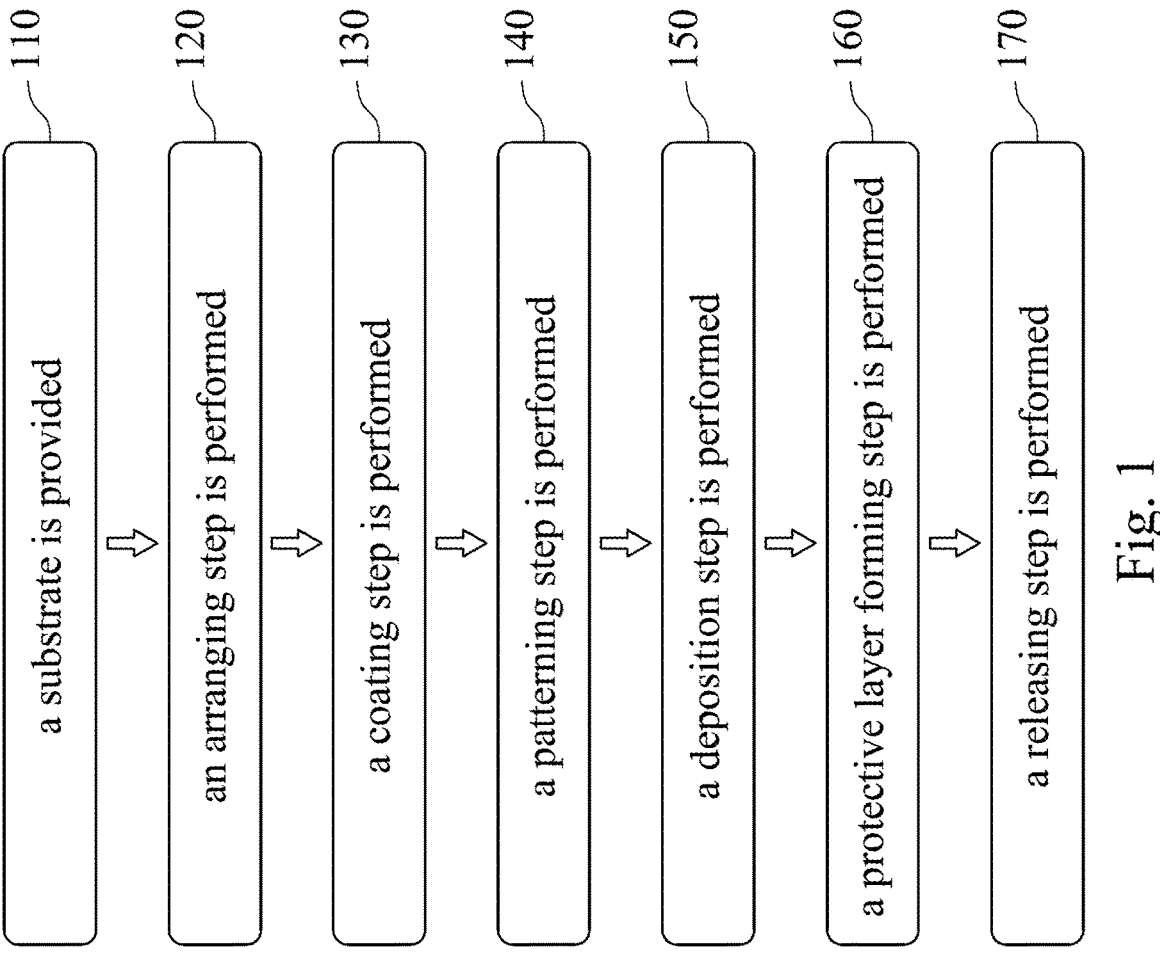
FIG. 1 is a step flow chart of a manufacturing method of a light-emitting diode package structure according to one embodiment of the present disclosure.

Please refer to FIG. 1. FIG. 1 is a step flow chart of a manufacturing method of a light-emitting diode package structure 100 according to one embodiment of the present disclosure. The manufacturing method of the light-emitting diode package structure 100 includes Step 110, Step 120, Step 130, Step 140, Step 150, Step 160 and Step 170.

Figure 2B:
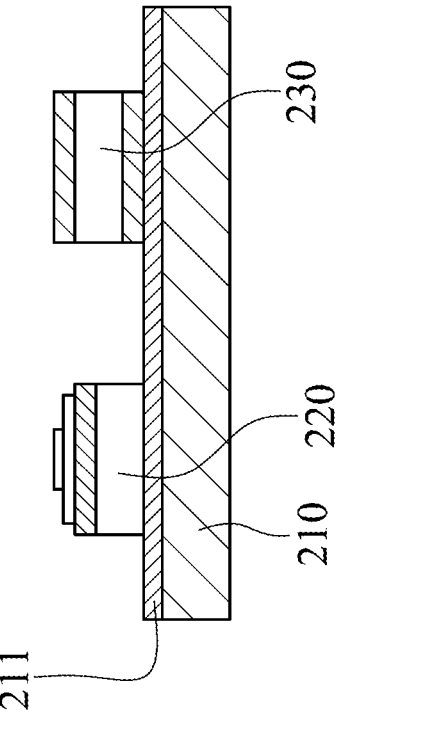
FIG. 2B is a structural schematic view of Step 120 of FIG. 1.
Figure 2A:
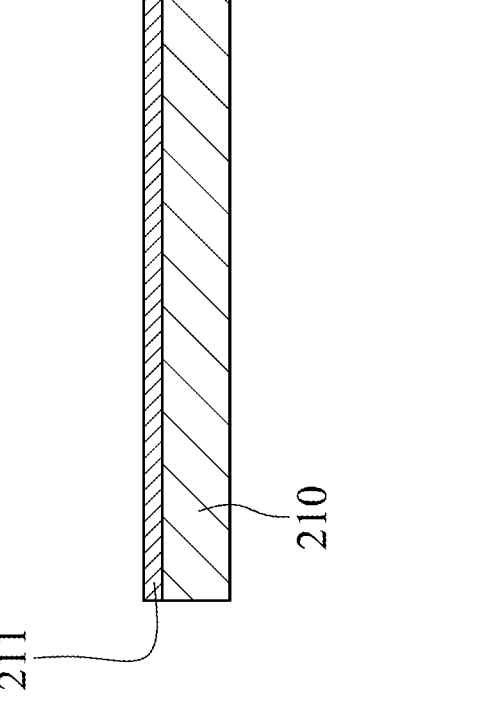
FIG. 2A is a structural schematic view of Step 110 of FIG. 1.

Please refer to FIG. 2A. FIG. 2A is a structural schematic view of Step 110 of FIG. 1. Step 110 is to provide a substrate 210. The substrate 210 can be a glass substrate and a surface thereof can include a releasable layer 211. The releasable layer 211 is for separating the substrate 210 and the light-emitting diode package structure which will be formed later. The specific manufacturing process will be explained in the following paragraphs, so the details will not be given herein.

Please refer to FIG. 2B. FIG. 2B is a structural schematic view of Step 120 of FIG. 1. Step 120 is performing an arranging step, wherein at least one light-emitting diode 220 and at least one dummy plug 230 are arranged on the surface of the substrate 210.

Figures 2C, 2D:
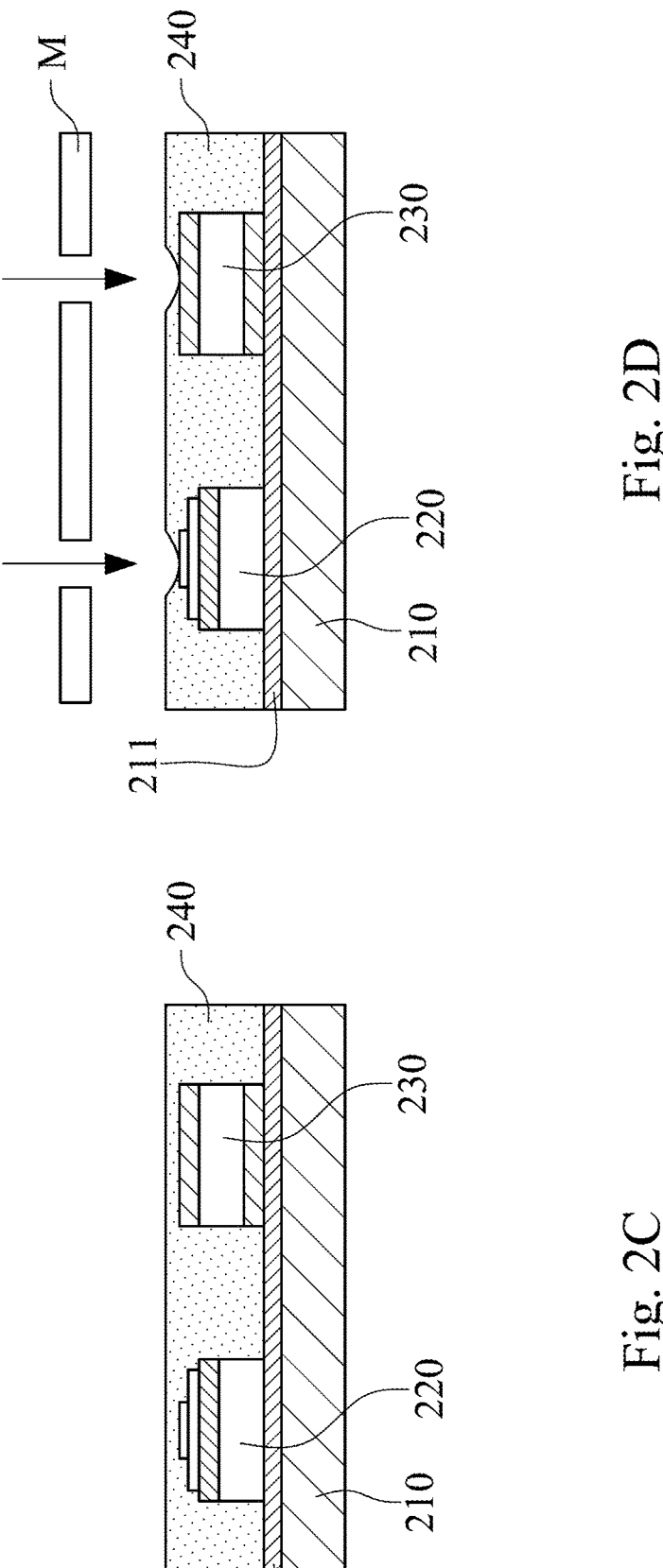
FIG. 2C is a structural schematic view of Step 130 of FIG. 1.
FIG. 2D is a structural schematic view of Step 140 of FIG. 1.

Please refer to FIG. 2C. FIG. 2C is a structural schematic view of Step 130 of FIG. 1. Step 130 is performing a coating step, wherein a patternable material 240 is coated on the surface of the substrate 210, and the at least one light-emitting diode 220 and the at least one dummy plug 230 are covered by the patternable material 240. Furthermore, the aforementioned releasable layer 211 can be between the substrate 210 and the at least one light-emitting diode 220, the at least one dummy plug 230 and the patternable material 240.

Please refer to FIG. 2D. FIG. 2D is a structural schematic view of Step 140 of FIG. 1. Step 140 is performing a patterning step, wherein the patternable material 240 is patterned, and a portion of the at least one light-emitting diode 220 and a portion of the at least one dummy plug 230 are exposed from the patternable material 240. Specifically, a mask M can be arranged above the patternable material 240, and then the patternable material 240 is etched. Hence, the patternable material 240 which is not covered by the mask M will be removed, and the portion of the at least one light-emitting diode 220 and the portion of the at least one dummy plug 230 will be exposed.

Specifically, the patternable material 240 can include a photoresist or a glue. If the patternable material 240 includes the photoresist, the photoresist will become partially uncured after being exposed to ultraviolet light or electron beams. In this regard, the uncured photoresist can be removed, so the portion of the at least one light-emitting diode 220 and the portion of the at least one dummy plug 230 are exposed. If the patternable material 240 includes the glue, the laser etching process can be performed on the glue. Because the electrodes on the top of the at least one light-emitting diode 220 and the at least one dummy plug 230 are metal, the laser has a high selectivity to the metal and the glue, so the glue can be efficiently removed. Also, it is favorable for reducing the manufacturing cost by using laser etching.

Figures 2E, 2F:
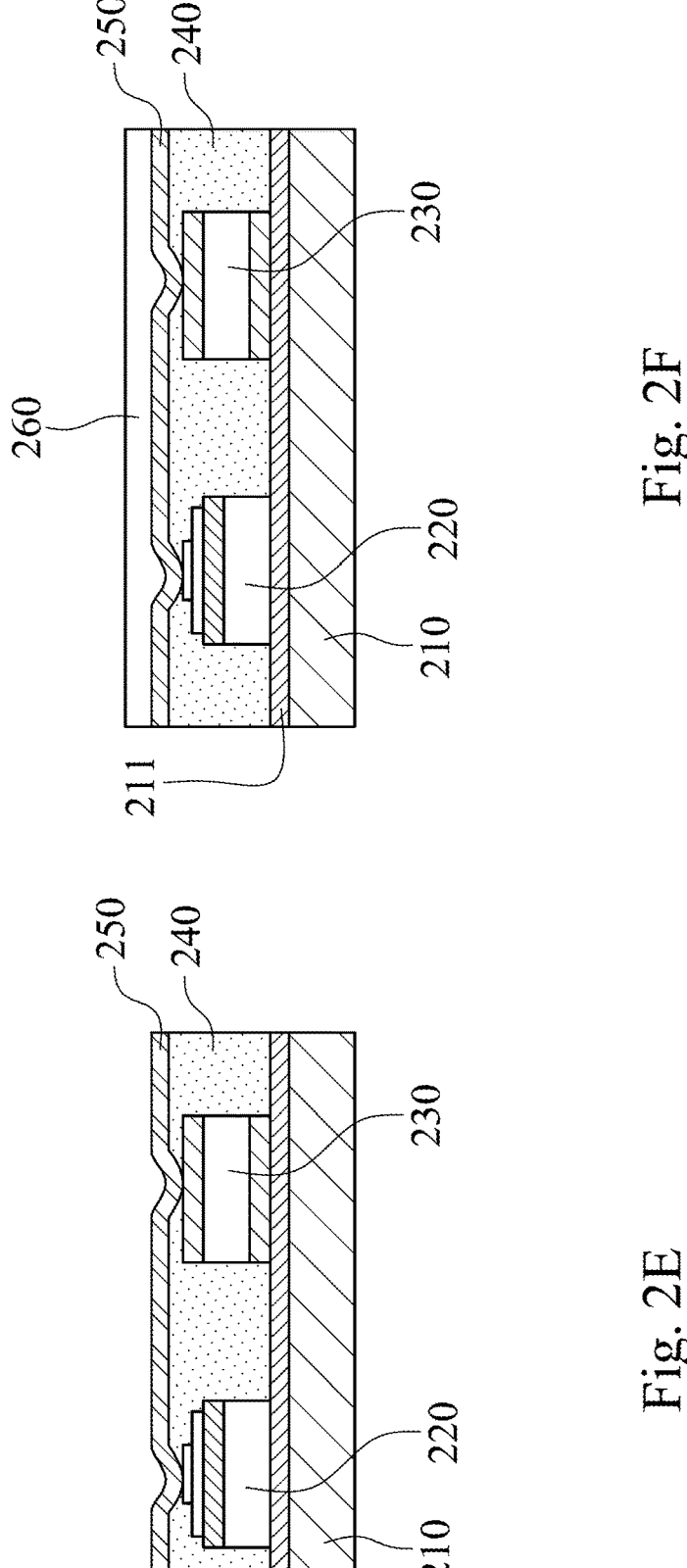
FIG. 2E is a structural schematic view of Step 150 of FIG. 1.
FIG. 2F is a structural schematic view of Step 160 of FIG. 1.

Please refer to FIG. 2E. FIG. 2E is a structural schematic view of Step 150 of FIG. 1. Step 150 is performing a deposition step, wherein a conductive layer 250 is formed on a side of the patternable material 240 away from the substrate 210, and the conductive layer 250 is in contact with and electrically connected to the portion of the at least one light-emitting diode 220 and the portion of the at least one dummy plug 230 which are exposed.

In detail, a material of the conductive layer 250 includes an indium tin oxide (ITO) material or a transparent conductive material, and the indium tin oxide material can include an indium tin oxide composition and a transition metal composition. The conductive layer 250 can include at least three coating layers (not shown in the figures), each of the at least three coating layers is made of the indium tin oxide composition or the transition metal composition, and the coating layers made of the indium tin oxide composition and the coating layers made of the transition metal composition can be stacked in an alternating way. The coating layer of the conductive layer 250 which is the most adjacent to the substrate 210 and the coating layer of the conductive layer 250 which is the furthest from the substrate 210 can be the coating layers made of the indium tin oxide composition. By applying the aforementioned materials, the conductive layer 250 can be formed on the patternable material 240 by a sputtering method under a room temperature, and an annealing process is not needed to meet the requirement of low sheet resistance after the conductive layer 250 is formed. The transition metal composition of the present disclosure can be transition metal elements or post-transition metal elements, especially the transition metal elements or the post-transition metal elements with low melting points. The transition metal composition can be selected from the group consisting of tin, indium, gallium, aluminum, zinc and silver. However, the present disclosure is not limited to the aforementioned materials.

Furthermore, a thickness of each of the coating layers made of the indium tin oxide composition can be 20 nm to 100 nm, and a thickness of each of the coating layers made of the transition metal composition can be 1 nm to 10 nm. Moreover, a thickness of the conductive layer 250 can be 50 nm to 200 nm. Therefore, the thickness of the conductive layer 250 is proper to provide good conductive properties, reduce manufacturing time and perform suitable transmittance.

Please refer to FIG. 2F. FIG. 2F is a structural schematic view of Step 160 of FIG. 1. Step 160 is performing a protective layer forming step, wherein a protective layer 260 is formed on a side of the conductive layer 250 away from the substrate 210.

Figure 2H:
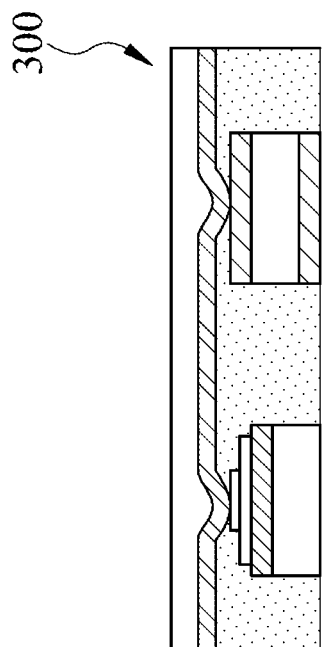
FIG. 2H is a structural schematic view of a product of the manufacturing method of the light-emitting diode package structure of FIG. 1.
Figure 2G:
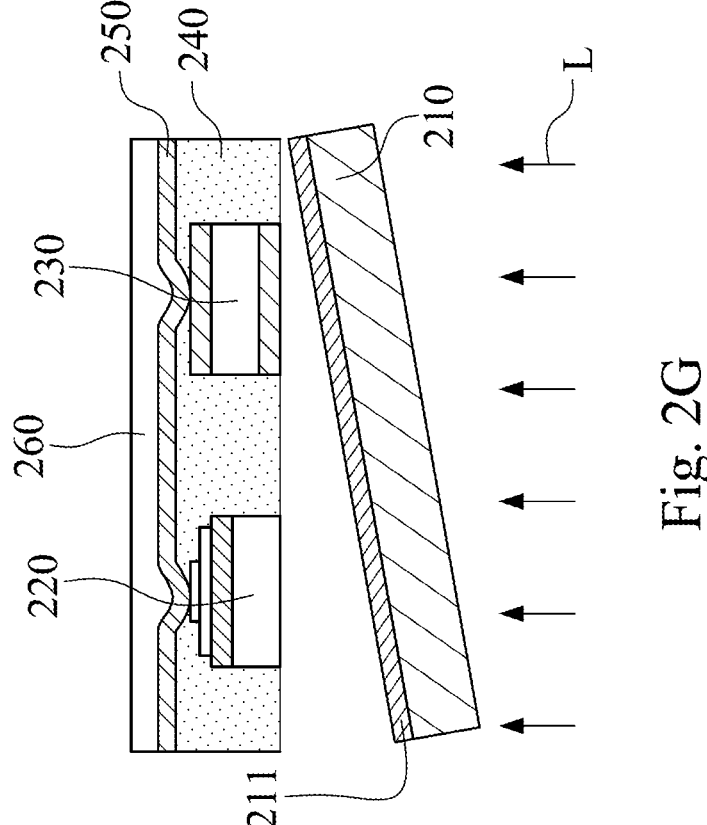
FIG. 2G is a structural schematic view of Step 170 of FIG. 1.

Please refer to FIG. 2G and FIG. 2H. FIG. 2G is a structural schematic view of Step 170 of FIG. 1. FIG. 2H is a structural schematic view of a product of the manufacturing method of the light-emitting diode package structure 100 of FIG. 1. Step 170 is performing a releasing step, wherein the substrate 210 is separated from the patternable material 240, the at least one light-emitting diode 220 and the at least one dummy plug 230, and a light-emitting diode package structure 300 is formed. In the releasing step, the substrate 210 is exposed to a light, heated or cooled down, and the releasable layer 211 is separated from the at least one light-emitting diode 220, the at least one dummy plug 230 and the patternable material 240. The substrate 210 is exposed to an ultraviolet light L for example herein. Also, the substrate 210 can be separated from other components by the methods such as a heating method or a mechanical method, and the present disclosure is not limited to the aforementioned releasing methods.

According to another embodiment of the present disclosure, the light-emitting diode package structure 300 can be made by the aforementioned manufacturing method of the light-emitting diode package structure 100.

Figure 3B:
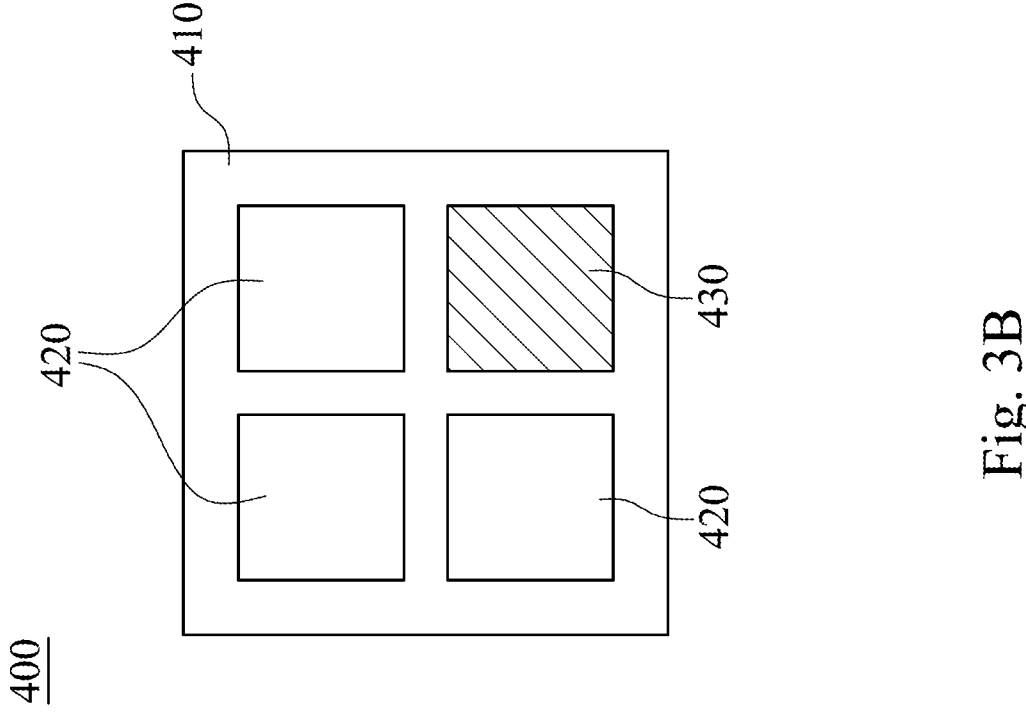
FIG. 3B is a bottom schematic view of the light-emitting diode package structure of FIG. 3A.
Figure 3A:
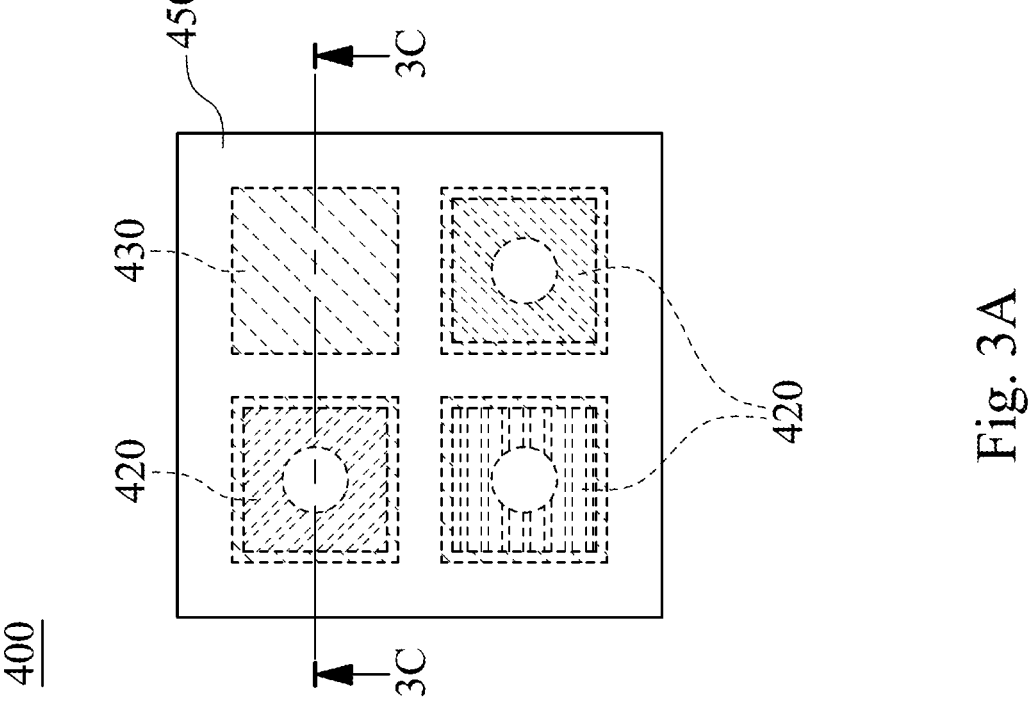
FIG. 3A is a top schematic view of a light-emitting diode package structure according to another embodiment of the present disclosure.
Figure 3C:
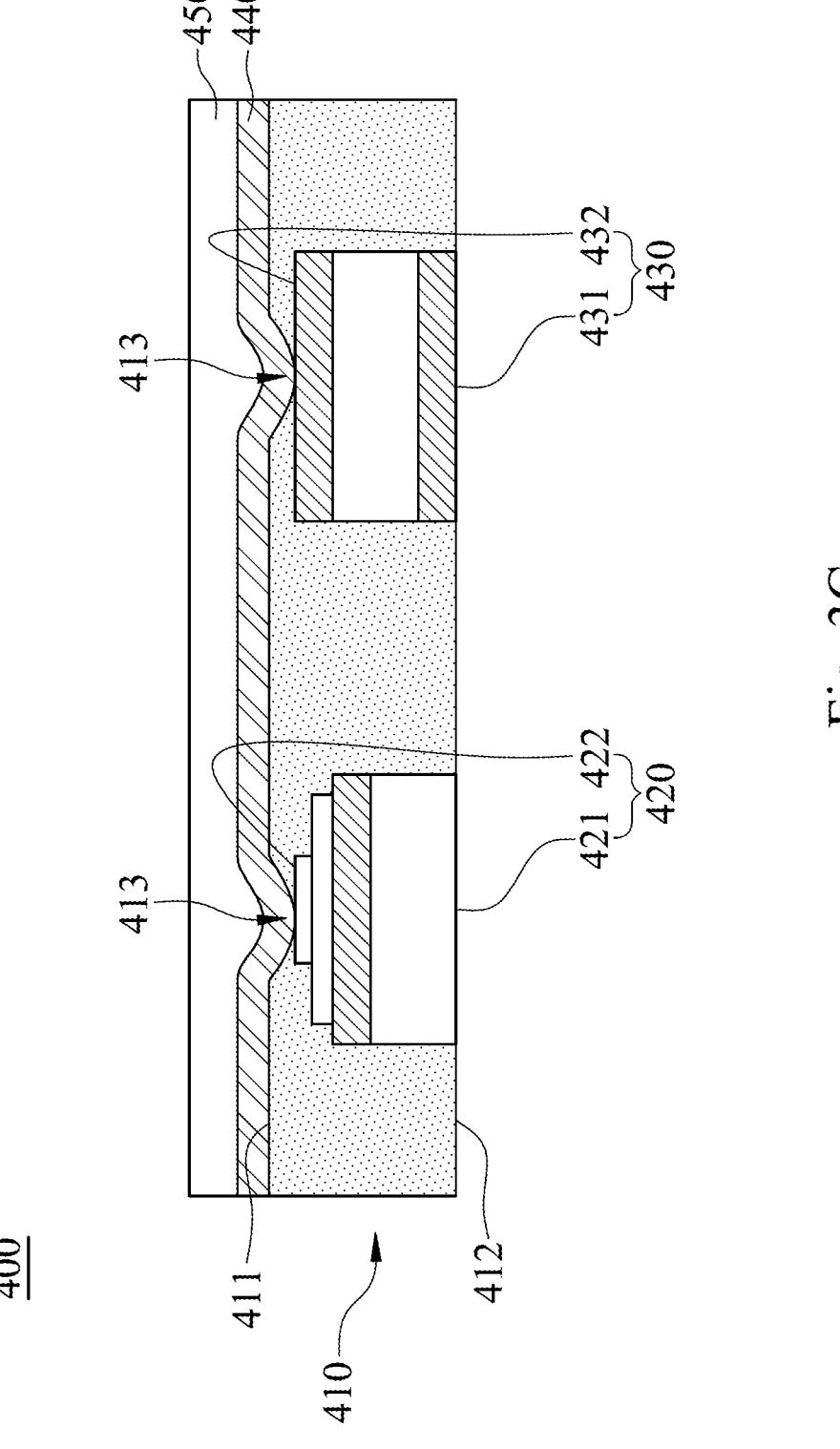
FIG. 3C is a cross-sectional schematic view of the light-emitting diode package structure of FIG. 3A along the line 3C-3C.

Please refer to FIG. 3A to FIG. 3C. FIG. 3A is a top schematic view of a light-emitting diode package structure 400 according to another embodiment of the present disclosure. FIG. 3B is a bottom schematic view of the light-emitting diode package structure 400 of FIG. 3A. FIG. 3C is a cross-sectional schematic view of the light-emitting diode package structure 400 of FIG. 3A along the line 3C-3C. The light-emitting diode package structure 400 includes a patternable material layer 410, at least one light-emitting diode 420, at least one dummy plug 430, a conductive layer 440 and a protective layer 450, which respectively have the same properties as the aforementioned patternable material 240, the at least one light-emitting diode 220, the at least one dummy plug 230, the conductive layer 250 and the protective layer 260, so the details will not be given herein again.

The patternable material layer 410 includes an upper surface 411 and a bottom surface 412. The at least one light-emitting diode 420 and the at least one dummy plug 430 are buried in the patternable material layer 410, and a first surface 421 of the at least one light-emitting diode 420 and a third surface 431 of the at least one dummy plug 430 are respectively exposed from the bottom surface 412 of the patternable material layer 410. The first surface 421 and the third surface 431 are for transferring the current.

The upper surface 411 of the patternable material layer 410 is covered by the conductive layer 440, and the conductive layer 440 is in contact with and electrically connected to the at least one light-emitting diode 420 and the at least one dummy plug 430. The protective layer 450 covers the conductive layer 440. In detail, the patternable material layer 410 includes at least two through holes 413, the at least one light-emitting diode 420 includes a second surface 422 opposite to the first surface 421, the at least one dummy plug 430 includes a fourth surface 432 opposite to the third surface 431, the at least two through holes 413 extend from the upper surface 411 of the patternable material layer 410 to the second surface 422 of the at least one light-emitting diode 420 and the fourth surface 432 of the at least one dummy plug 430, and the conductive layer 440 is in contact with the second surface 422 of the at least one light-emitting diode 420 and the fourth surface 432 of the at least one dummy plug 430 through the at least two through holes 413.

The present disclosure will be further exemplified by the following specific embodiments so as to facilitate utilizing and practicing the present disclosure completely by the people skilled in the art without over-interpreting and over-experimenting. However, the readers should understand that the present disclosure should not be limited to these practical details thereof, that is, these practical details are used to describe how to implement the materials and methods of the present disclosure and are not necessary.

In the 1st example, the 2nd example, the 1st comparative example and the 2nd comparative example, the electrical properties and optical properties of the conductive layers with different structures are disclosed. The structures of the conductive layers of the aforementioned examples and comparative examples are shown as Table 1 below.

TABLE 1

| | | Coating Layer 1 | Coating Layer 2 | Coating Layer 3 | Coating Layer 4 | Coating Layer 5 |
|---|---|---|---|---|---|---|
| 1st Comparative Example | Material | ITO | | | | |
| | Thickness (nm) | 100 | | | | |
| 2nd Comparative Example | Material | ITO | | | | |
| | Thickness (nm) | 200 | | | | |
| 1st Example | Material | ITO | silver | ITO | | |
| | Thickness (nm) | 40 | 5 | 40 | | |
| 2nd Example | Material | ITO | silver | ITO | silver | ITO |
| | Thickness (nm) | 40 | 5 | 80 | 5 | 40 |

The coating layer 1 to the coating layer 5 in the Table 1 above is sequentially the coating layer which is the most adjacent to the substrate to the coating layer which is the furthest from the substrate. The measurement results of sheet resistance and transmittance of the aforementioned examples and comparative examples are shown as Table 2 below.

TABLE 2

| | Sheet Resistance (Ω/sq) | Transmittance (%) |
|---|---|---|
| 1st Comparative Example | 78.65 | 77 |
| 2nd Comparative Example | 41.67 | 73 |
| 1st Example | 7.628 | 85 |
| 2nd Example | 3.715 | 72 |

Figure 4:
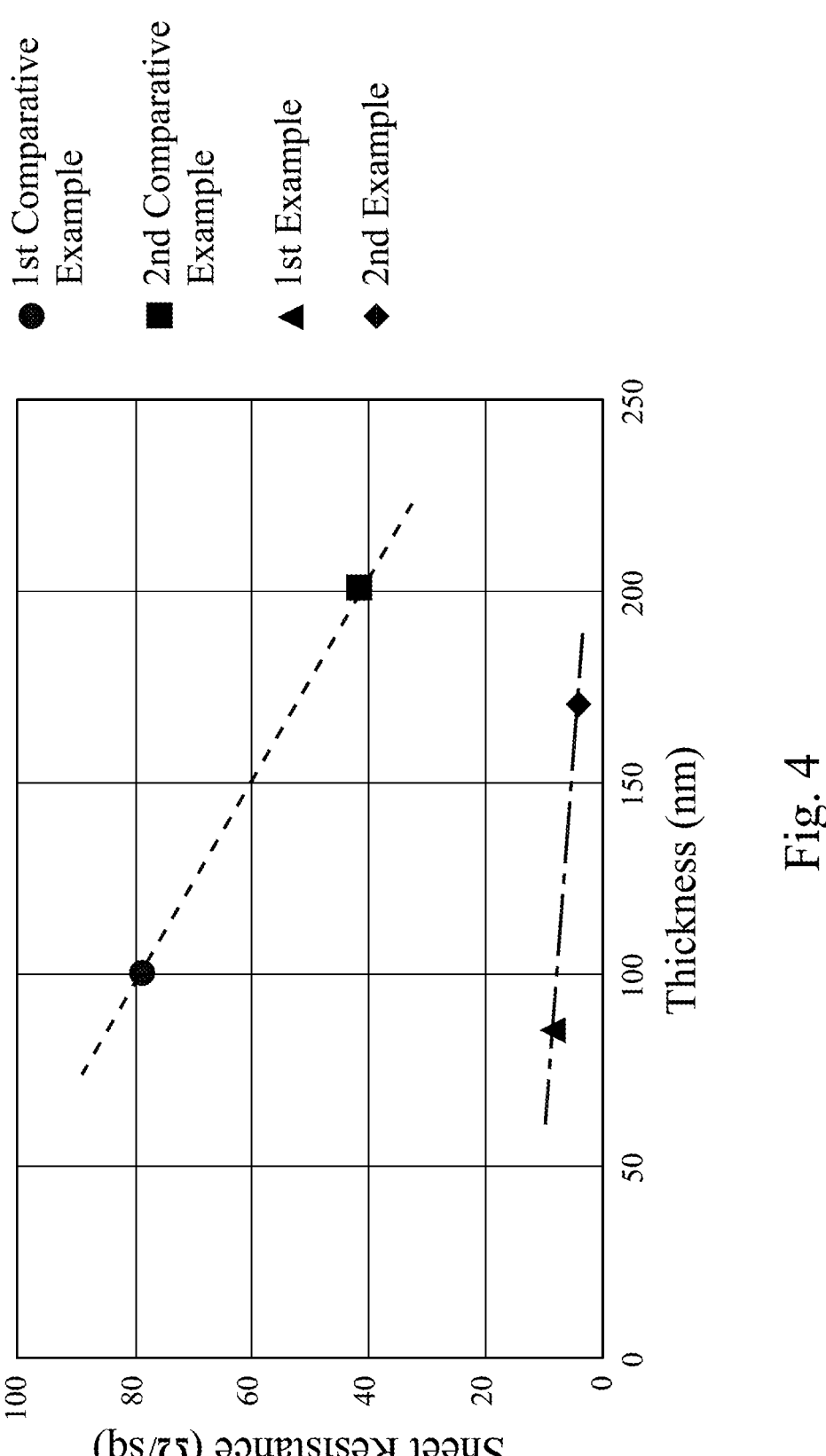
FIG. 4 is a relationship diagram of the sheet resistance and the thickness of conductive layer of the 1st example, the 2nd example, the 1st comparative example and the 2nd comparative example.
Figure 5:
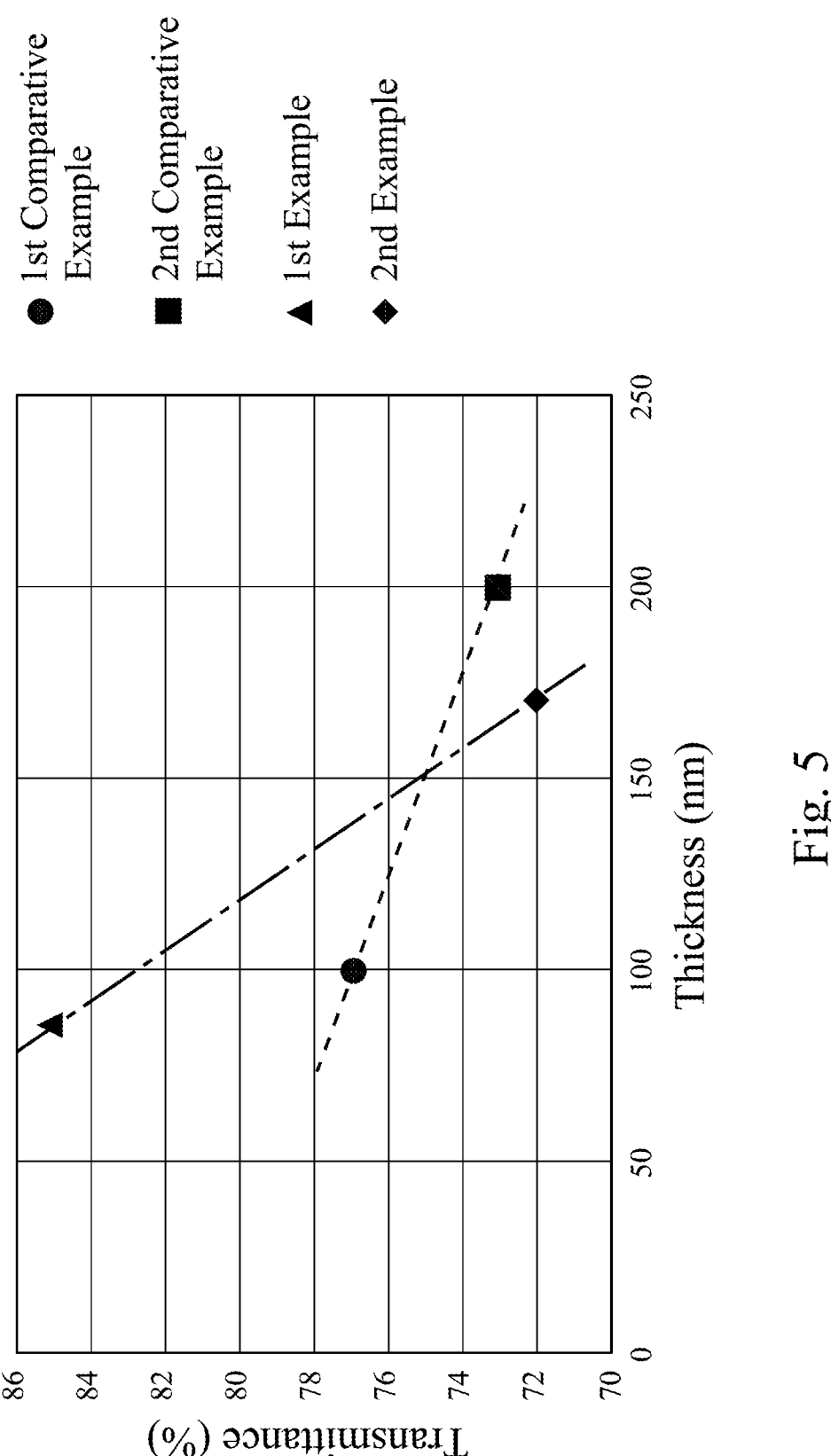
FIG. 5 is a relationship diagram of the transmittance and the thickness of conductive layer of the 1st example, the 2nd example, the 1st comparative example and the 2nd comparative example.

Please also refer to FIG. 4 and FIG. 5. FIG. 4 is a relationship diagram of the sheet resistance and the thickness of conductive layer of the 1st example, the 2nd example, the 1st comparative example and the 2nd comparative example. FIG. 5 is a relationship diagram of the transmittance and the thickness of conductive layer of the 1st example, the 2nd example, the 1st comparative example and the 2nd comparative example. From the experimental results, the sheet resistance of the 1st example and the 2nd example is significantly smaller than that of the 1st comparative example and the 2nd comparative example. It means that the conductive properties can be obviously improved by the structure of the conductive layer and the related manufacturing method according to the present disclosure. Furthermore, the transmittance of the 1st example is significantly higher than that of the 1st comparative example and the 2nd comparative example. Although the transmittance of the 2nd example decreases, but the transmittance thereof is still similar to that of the 2nd comparative example and higher than 70%. It means that a great transmittance can be obtained by the structure of the conductive layer and the related manufacturing method according to the present disclosure.

Accordingly, in the present disclosure, the circuit configuration can be done without wire bonding by the deposition of the conductive layer on the light-emitting diode and the dummy plug. Thus, the efficiency and yield of the manufacturing process can be improved. Furthermore, the light-emitting diode package structure is formed by releasing the substrate in the present disclosure. The substrate can be reused, which can reduce the cost and is also favorable for the miniaturization of the light-emitting diode package structure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method of a light-emitting diode package structure, comprising:

providing a substrate;

performing an arranging step, wherein at least one light-emitting diode and at least one dummy plug are arranged on a surface of the substrate;

performing a coating step, wherein a patternable material is coated on the surface of the substrate, and the at least one light-emitting diode and the at least one dummy plug are covered by the patternable material;

performing a patterning step, wherein the patternable material is patterned, and a portion of the at least one light-emitting diode and a portion of the at least one dummy plug are exposed from the patternable material;

performing a deposition step, wherein a conductive layer is formed on a side of the patternable material away from the substrate, and the conductive layer is in contact with and electrically connected to the portion of the at least one light-emitting diode and the portion of the at least one dummy plug which are exposed;

performing a protective layer forming step, wherein a protective layer is formed on a side of the conductive layer away from the substrate; and performing a releasing step, wherein the substrate is separated from the patternable material, the at least one light-emitting diode and the at least one dummy plug, and a light-emitting diode package structure is formed;

wherein a material of the conductive layer comprises an indium tin oxide material or a transparent conductive material.

2. The manufacturing method of the light-emitting diode package structure of claim 1, wherein in the deposition step, the conductive layer is formed on the patternable material by a sputtering method under a room temperature.

3. The manufacturing method of the light-emitting diode package structure of claim 1, wherein the indium tin oxide material comprises an indium tin oxide composition and a transition metal composition.

4. The manufacturing method of the light-emitting diode package structure of claim 3, wherein the conductive layer comprises at least three coating layers, each of the at least three coating layers is made of the indium tin oxide composition or the transition metal composition, and the coating layers made of the indium tin oxide composition and the coating layers made of the transition metal composition are stacked in an alternating way.

5. The manufacturing method of the light-emitting diode package structure of claim 4, wherein the coating layer of the conductive layer which is the most adjacent to the substrate and the coating layer of the conductive layer which is the furthest from the substrate are the coating layers made of the indium tin oxide composition.

6. The manufacturing method of the light-emitting diode package structure of claim 4, wherein a thickness of each of the coating layers made of the indium tin oxide composition is 20 nm to 100 nm, and a thickness of each of the coating layers made of the transition metal composition is 1 nm to 10 nm.

7. The manufacturing method of the light-emitting diode package structure of claim 1, wherein a thickness of the conductive layer is 50 nm to 200 nm.

8. The manufacturing method of the light-emitting diode package structure of claim 1, wherein the surface of the substrate comprises a releasable layer, the releasable layer is between the substrate and the at least one light-emitting diode, the at least one dummy plug and the patternable material, and in the releasing step, the substrate is exposed to a light, heated or cooled down, and the releasable layer is separated from the at least one light-emitting diode, the at least one dummy plug and the patternable material.

9. A light-emitting diode package structure, which is made by the manufacturing method of the light-emitting diode package structure of claim 1.

* * * * *